United States Patent
Kusuda et al.

(10) Patent No.: US 10,182,515 B2
(45) Date of Patent: Jan. 15, 2019

(54) CONDUCTION COOLED MODULE

(71) Applicant: The Boeing Company, Huntington Beach, CA (US)

(72) Inventors: Charles E. Kusuda, Mukilteo, WA (US); Jeffrey W. Glasnovich, Bothell, WA (US); Erik L. Godo, Redmond, WA (US); Roy D. Nye, Snohomish, WA (US); Namsoo P. Kim, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 339 days.

(21) Appl. No.: 14/268,006

(22) Filed: May 2, 2014

(65) Prior Publication Data
US 2015/0319881 A1 Nov. 5, 2015

(51) Int. Cl.
*H05K 5/00* (2006.01)
*H05K 7/20* (2006.01)

(52) U.S. Cl.
CPC ......... *H05K 7/20536* (2013.01); *H05K 7/205* (2013.01); *H05K 7/207* (2013.01); *H05K 7/20509* (2013.01)

(58) Field of Classification Search
CPC ... H01L 23/473; G06F 1/20; G06F 2200/201; G06F 1/185; H05K 7/20509; H05K 1/0203; H05K 1/0272; H05K 1/0206
See application file for complete search history.

(56) References Cited

U.S. PATENT DOCUMENTS

| | | | | |
|---|---|---|---|---|
| 4,849,858 A * | 7/1989 | Grapes | ................. | H05K 1/0203 165/185 |
| 5,195,021 A * | 3/1993 | Ozmat | ................. | H01L 23/3735 174/252 |
| 5,754,403 A * | 5/1998 | Ozmat | ................. | H01L 23/3735 174/252 |
| 5,949,650 A * | 9/1999 | Bulante | ................. | H05K 1/056 165/185 |
| 6,246,582 B1 * | 6/2001 | Habing | ................. | H05K 7/1404 257/727 |

(Continued)

FOREIGN PATENT DOCUMENTS

WO    WO 2001-049092 A1    7/2001

OTHER PUBLICATIONS

ANSI/VITA 48.2 Mechanical Specifications for Microcomputers Using REDI Conduction Cooling Applied to VITA VPX, American National Standards Institute, Jul. 2010, 53 pages.

(Continued)

*Primary Examiner* — Jayprakash N Gandhi
*Assistant Examiner* — Hung Dang
(74) *Attorney, Agent, or Firm* — MH2 Technology Law Group LLP

(57) ABSTRACT

In one aspect, conduction cooled modules are described herein. In some implementations, a conduction cooled module comprises first and second external support structures arranged in facing opposition to one another, forming a component envelope therebetween. In some implementations, the modules are configured to contact at least one cold plate and to retain at least one printed wiring board in the component envelope in between the first external support structure and the second external support structure.

20 Claims, 7 Drawing Sheets

(56) References Cited

U.S. PATENT DOCUMENTS

| | | | |
|---|---|---|---|
| 6,421,240 B1* | 7/2002 | Patel | H05K 7/20763 |
| | | | 165/104.33 |
| 6,661,664 B2* | 12/2003 | Sarno | H05K 7/20545 |
| | | | 165/104.33 |
| 7,071,258 B1 | 7/2006 | Jang et al. | |
| 7,349,221 B2* | 3/2008 | Yurko | H05K 7/1404 |
| | | | 165/80.2 |
| 7,599,184 B2* | 10/2009 | Upadhya | H05K 7/20727 |
| | | | 165/104.33 |
| 7,933,125 B2* | 4/2011 | Wei | G06F 1/20 |
| | | | 165/185 |
| 8,263,843 B2 | 9/2012 | Kim et al. | |
| 9,131,628 B2* | 9/2015 | Lu | H05K 7/20445 |
| 2007/0211442 A1* | 9/2007 | Miller | H05K 7/1404 |
| | | | 361/752 |
| 2008/0019102 A1 | 1/2008 | Yurko | |
| 2009/0277616 A1* | 11/2009 | Cipolla | F28D 15/0233 |
| | | | 165/104.33 |
| 2010/0053901 A1 | 3/2010 | Irving et al. | |
| 2010/0327504 A1* | 12/2010 | Seidel | B25B 5/003 |
| | | | 269/43 |
| 2011/0042649 A1 | 2/2011 | Duvall et al. | |
| 2011/0205712 A1 | 8/2011 | Colongo | |
| 2011/0267673 A1* | 11/2011 | Agrawal | G02F 1/155 |
| | | | 359/267 |

OTHER PUBLICATIONS

French Preliminary Search Report and Opinion dated Nov. 30, 2017 from corresponding French Application No. 15 51905 (english translation of document being provided).

\* cited by examiner

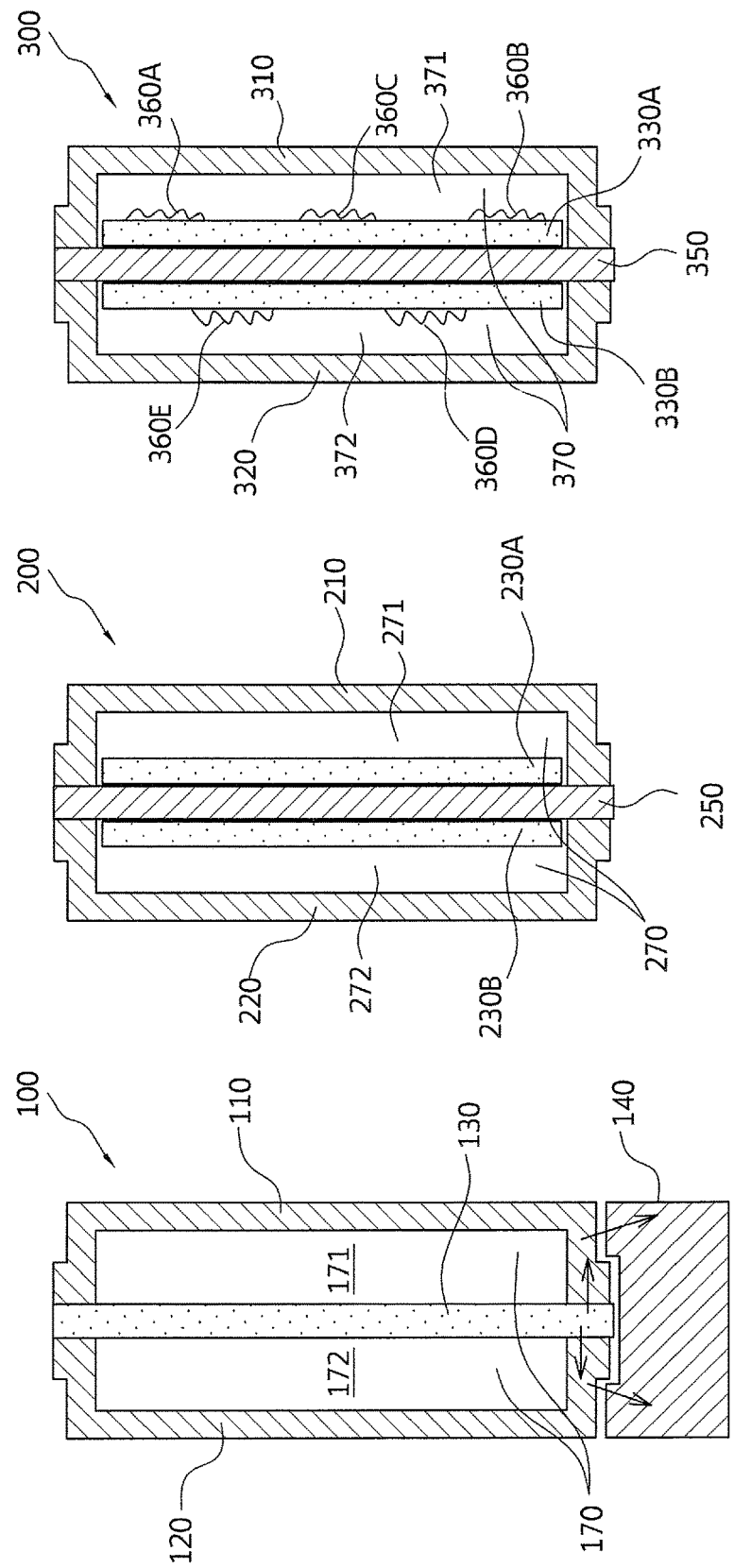

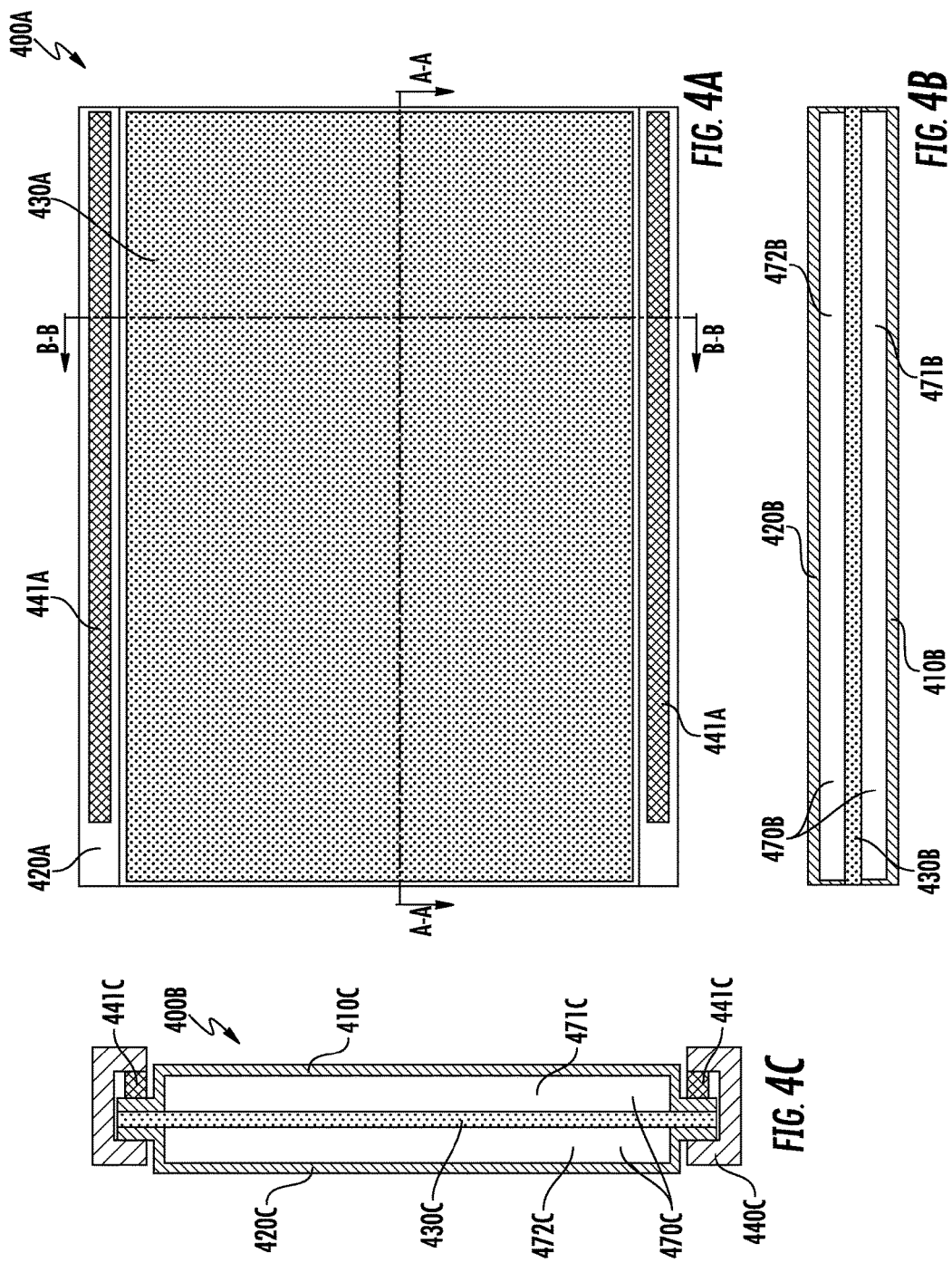

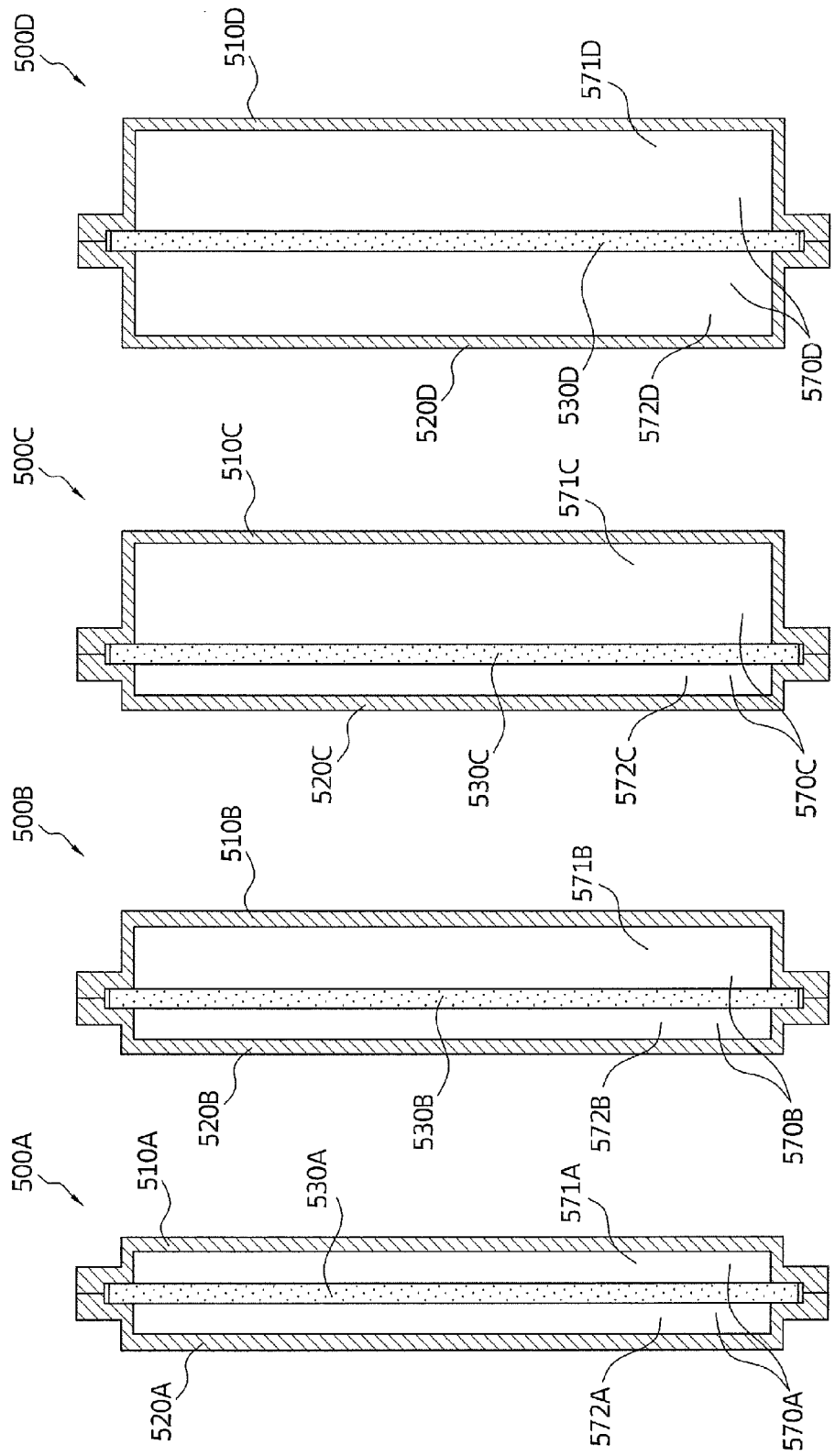

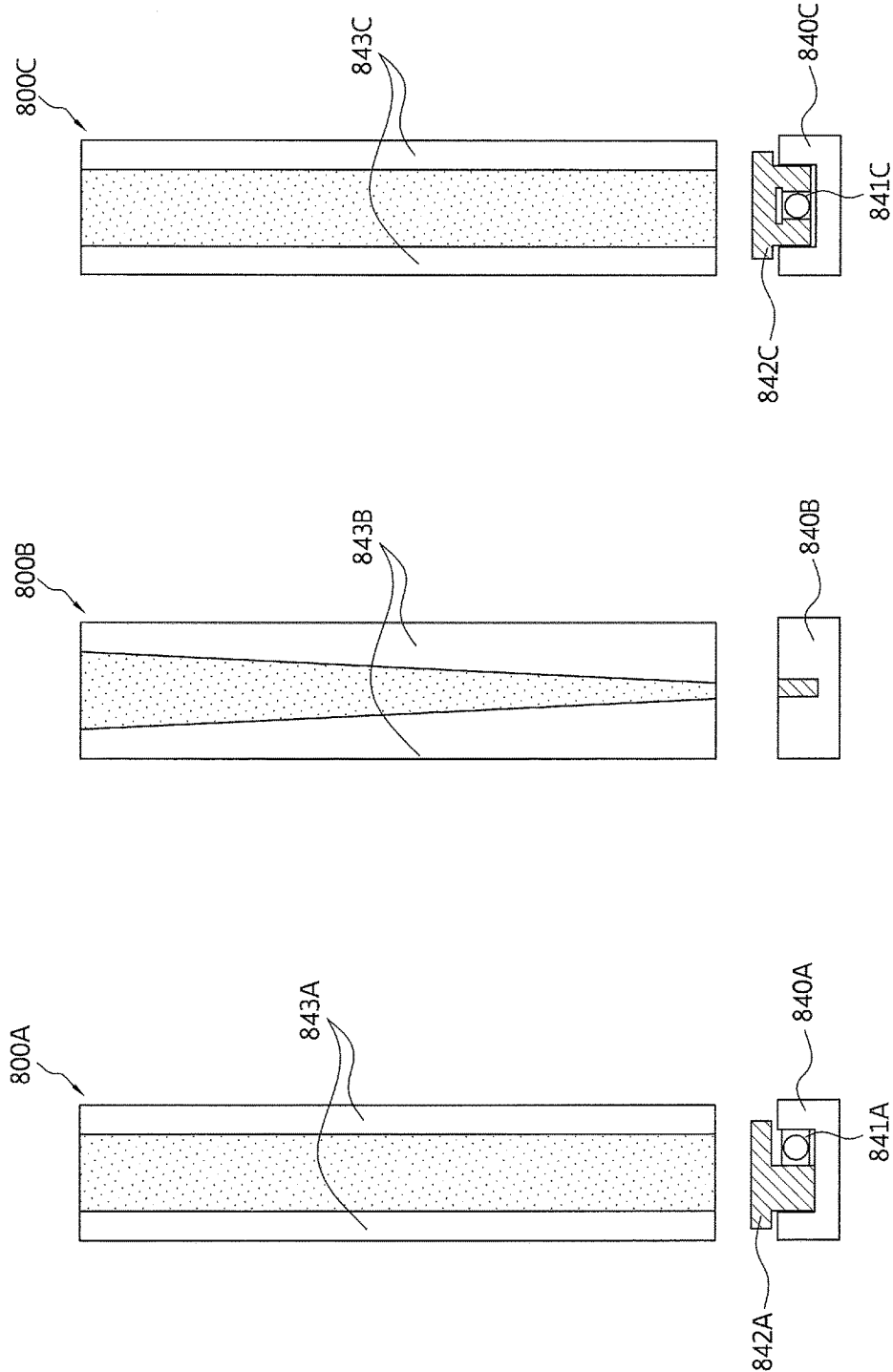

CONDUCTION COOLED MODULE

FIELD

This disclosure relates to packaging of electrical and/or electronic circuitry and, in particular, to form factors for thermal management and/or packaging of electrical and/or electronic circuitry on circuit cards.

BACKGROUND

When used in electronics applications, such as, for example, electronics designed for use in aerospace, or other applications, circuit cards are generally provided with packaging which provides structural support and/or thermal management to the circuit cards and corresponding electronic circuitry. Commonly used form factors for packaging and thermal management of electronic circuitry result in large, heavy, and thermally-limited, line-replaceable unit designs. Therefore, there exists a need for improved form factors or modules of a decreased volume, lighter weight, and/or improved thermal management.

SUMMARY

In one aspect, conduction cooled modules are described herein which, in some implementations, may provide one or more advantages over previous modules. For example, in some cases, conduction cooled modules described herein can have decreased volume, lighter weight, and/or improved thermal management compared to other form factors or modules. Further, in some instances, conduction cooled modules described herein can accommodate electronics functionality commonly used in aerospace or other applications in less volume, with less weight, and/or with improved thermal management. Therefore, in some implementations, a conduction cooled module described herein may enable installation of new electronic system function, such system function made available in a required volume suited for existing electrical bays, precluding the need for additional equipment installation volumes. In addition, in some implementations, a conduction cooled module described herein can have a structure that permits reduced equipment installation times. Moreover, in some implementations, a conduction cooled module described herein can provide decreased weight for electrical and/or electronic systems, providing increased payload capability for aerospace or similar applications. Further, in some implementations, a conduction cooled module described herein contains electromagnetic emissions within the module and/or attenuates electromagnetic interference. As described further hereinbelow, one or more of the foregoing advantages may be provided by conduction cooled modules having certain external support structure, component envelope, and other architectures described herein.

A conduction cooled module described herein, in some implementations, comprises first and second external support structures in facing opposition to one another. In some implementations, a component envelope is defined by the first and second external support structures and is located between the first and second external support structures. In some implementations, the conduction cooled module is a line-replaceable unit. In addition, in some implementations, the first and second external support structures are configured to contact at least one cold plate and to retain at least one printed wiring board in the component envelope in between the first and second external support structures. In some implementations, the first and second support structures form a continuous, and, in some implementations, a primary heat conduction pathway between the printed wiring board and the cold plate. In some implementations, the first and/or second external support structures comprise one or more heat exchanger surfaces extending into the component envelope.

In some implementations, a conduction cooled module described herein comprises a thermally conductive substrate disposed between the first and second external support structures, the substrate being configured to contact the at least one printed wiring board. Further, in some implementations, the substrate is configured to contact a first printed wiring board on a first side of the substrate and a second printed wiring board on a second side of the substrate in facing opposition to the first side of the substrate. Further, in some implementations, at least one printed wiring board comprises one or more electronic components extending into the component envelope adjacent to the surface of the printed wiring board, preferably above the surface of the printed wiring board.

Further, in some implementations, the at least one printed wiring board divides the component envelope into a first component envelope portion and a second component envelope portion. The first and second envelope portions, in some implementations, have substantially equal heights. In some implementations, the first and second envelope portions have substantially different heights. In one implementation, the component envelope has a height between about 0.2 to about 1.5 inches.

Moreover, in some implementations, the first external support structure and/or the second external support structures comprise one or more heat exchanger surfaces extending into the component envelope. In certain implementations, the first external support structure and/or the second external support structure comprises or is formed from a composite material comprising graphene particles dispersed in a matrix material. In alternative implementations, the first external support structure and/or the second external support structure comprises or is formed from aluminum, aluminum alloys, copper, copper alloys, titanium, titanium alloys, stainless steel, or combinations thereof. In further implementations, a conduction cooled module described herein further comprises a connector envelope engaging the first and second external support structures on one end of the first and second external support structures.

In some implementations, a conduction cooled module described herein can be a line replaceable unit. Further, in some implementations, the at least one cold plate of a conduction cooled module described herein can be a portion of a rack. In some implementations, a cold plate is part of a shelf, and the shelf is also part of a rack. In certain cases, the first external support structure and the second external support structure are configured to contact the at least one cold plate with a wedged, forked, or clamped interface.

In another aspect, conduction cooling racks are described herein which, in some implementations, may provide one or more advantages over known conduction cooling racks. In some cases, for example, a conduction cooling rack described herein can be used to house one or more conduction cooled modules.

A conduction cooling rack, in some implementations described herein, comprises first and second cold plate surfaces separated from and in facing opposition to one another. In some implementations, the first and second cold plate surfaces define an interior rack volume. In addition, in some implementations, one or more conduction cooled modules are disposed in the interior rack volume between the first and second cold plate surfaces in physical contact with the first and second cold plate surfaces.

Further, in some implementations, at least one of the conduction cooled modules disposed in the interior rack volume comprises first and second external support structures in facing opposition to one another. Thus, in some implementations, a component envelope is defined by the first and second external support structures and is located between the first and second external support structures. In some implementations, the first and second external support structures are configured to contact the first and second cold plate surfaces and to retain at least one printed wiring board in the component envelope in between the first and second external support structures.

These and other implementations are described in greater detail in the detailed description which follows.

BRIEF DESCRIPTION OF THE DRAWINGS

FIG. 1 illustrates a cross-sectional front view of a conduction cooled module according to one implementation described herein.

FIG. 2 illustrates a cross-sectional front view of a conduction cooled module according to one implementation described herein.

FIG. 3 illustrates a cross-sectional front view a conduction cooled module according to one implementation described herein.

FIG. 4A illustrates a cross-sectional side view of a conduction cooled module according to one implementation described herein.

FIG. 4B illustrates a cross-sectional top view of a conduction cooled module according to one implementation described herein.

FIG. 4C illustrates a cross-sectional front view of a conduction cooled module according to one implementation described herein FIG. 5A illustrates a cross-sectional front view of a conduction cooled module according to one implementation described herein.

FIG. 5B illustrates a cross-sectional front view of a conduction cooled module according to one implementation described herein.

FIG. 5C illustrates a cross-sectional front view of a conduction cooled module according to one implementation described herein.

FIG. 5D illustrates a cross-sectional front view of a conduction cooled module according to one implementation described herein.

FIG. 8A illustrates a cross-sectional front view of a conduction cooled module according to one implementation described herein.

FIG. 8B illustrates a cross-sectional front view of a conduction cooled module according to one implementation described herein.

FIG. 8C illustrates a cross-sectional front view of a conduction cooled module according to one implementation described herein.

DETAILED DESCRIPTION

Figure 6:
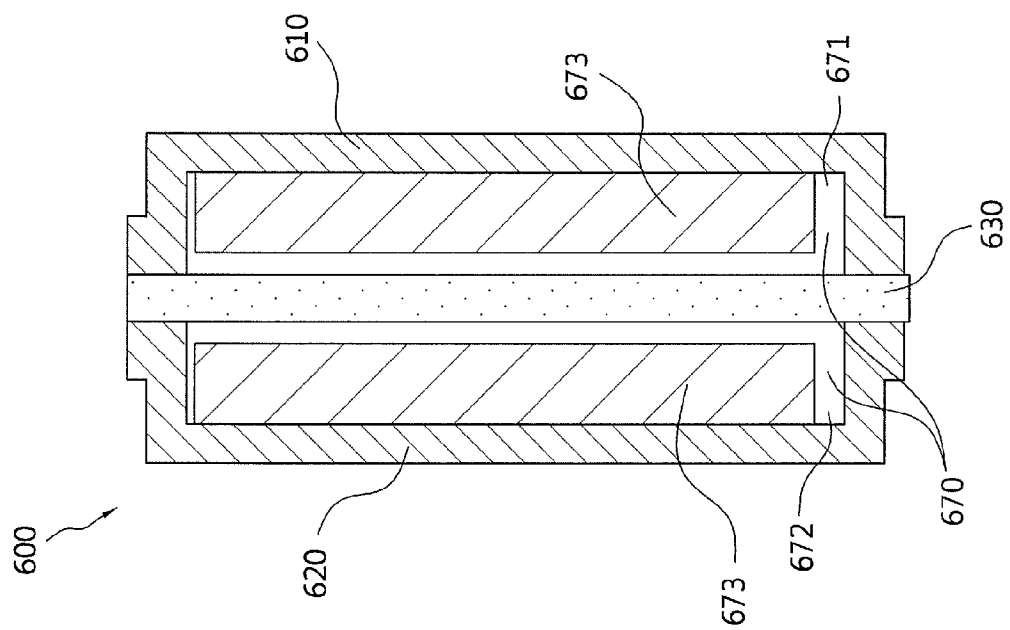
FIG. 6 illustrates a cross-sectional front view of a conduction cooled module according to one implementation described herein.

Implementations described herein can be understood more readily by reference to the following detailed description, examples, and drawings. Elements, apparatus, and methods described herein, however, are not limited to the specific implementations presented in the detailed description, examples, and drawings. It should be recognized that these implementations are merely illustrative of the principles of the present disclosure. Further, dimensions provided for specific examples or drawings herein are not intended to limit additional or alternative implementations of elements, apparatus, and methods described herein. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Conduction Cooled Module

In one aspect, conduction cooled modules are described herein. In some implementations, a conduction cooled module comprises first and second external support structures, wherein the second external support structure is in facing opposition to the first external support structure. As utilized herein, the term "facing opposition" means that each of the first and second external support structures comprises first and second sides, wherein the first side of one support structure is configured to face a first side of the another support structure. In some implementations, the conduction cooled module further comprises a component envelope defined by the first and second external support structures, and is located between the first and second external support structures. In addition, in some implementations, the first and second external support structures are configured to contact at least one cold plate and to retain at least one printed wiring board ("PWB") in the component envelope in between the first and second support structures.

In some implementations, a conduction cooled module described herein may be a line replaceable unit ("LRU"). As used herein, the term LRU refers to an item or component which may be quickly installed or replaced at an operating location. Further, an LRU may be replaced at the field level, for example, in the event of failure, in order that the overall assembly or structure comprising the LRU may be operated with a replacement LRU while the primary LRU undergoes repairs, thereby obviating the necessity to remove the LRU-containing assembly from service in order to repair a single component. Therefore, in some implementations, a conduction cooled module as described herein may be a component of a larger assembly, or may interface with or comprise a cold plate which is, for example, a component of a larger assembly or of a conduction cooled rack, etc.

Any materials not inconsistent with the objectives of the present disclosure may be used. In some implementations, for instance, the first external support structure and/or the second external support structure comprises or is formed from aluminum, aluminum alloys, copper, copper alloys, titanium, titanium alloys, stainless steel, brass, or combinations thereof.

Moreover, in some implementations, the first external support structure and/or the second external support structure comprises or is formed from a composite material comprising graphene particles dispersed in a matrix material. In some cases, the matrix is thermally conductive. Moreover, a matrix can comprise or be formed from any material not inconsistent with the objectives of the present disclosure. For example, in some cases, a matrix comprises or is formed from a metal. Any metal not inconsistent with the objectives of the present disclosure may be used. In some implementations, the matrix of a composite material described herein comprises a metal selected from the group consisting of aluminum, aluminum alloys, copper, copper alloys, titanium, titanium alloys, stainless steel, brass, and combinations thereof.

In some instances, a matrix comprises or is formed from a non-metal material, such as a polymeric material. Any polymeric material not inconsistent with the objectives of the present invention may be used. In some cases, a polymeric material is selected from the group consisting of a thermoset material and a thermoplastic material. In some implementations, a matrix comprises or is formed from a polycarbonate, a polyethylene such as a high-density polyethylene, a polypropylene, a polyvinyl chloride (PVC), an acrylonitrile butadiene styrene (ABS) polymer, a maleimide or bismaleimide, a phenol formaldehyde polymer, a polyepoxide, a polyether ether ketone (PEEK) polymer, a polyetherimide (PEI), a polyimide, a polysulfone, or a combination of one or more of the foregoing. It is understood that, for the purposes of the present disclosure, where a high thermal conductivity is desired, such polymeric or other materials having a low thermal conductivity will desirably have their conductivity enhanced by an incorporated conductive material such as, for example, thermally conductive graphite-containing materials (such as, for example, pyrolytic graphite) or graphene.

Moreover, in some instances, the matrix of a composite material described herein comprises or is formed from one or more glass, ceramic or other refractory material, and carbon. A matrix can also comprise or be formed from a combination of a metal, polymeric material, glass material, ceramic material, and carbon material.

In addition, any graphene particles not inconsistent with the objectives of the present disclosure may be used in a composite material described herein. According to the present disclosure, one exemplary graphene particle is a one-atom thick planar sheet of $sp^2$-bonded carbon atoms that are densely packed in a honeycomb crystal lattice.

Graphene particles of a composite material described herein can have any size and shape not inconsistent with the objectives of the present disclosure. In some cases, for instance, graphene particles have an anisotropic shape, such as a rod or needle shape or a platelet shape. In some implementations, graphene particles comprise graphene platelets, nanosheets, or nanoplatelets formed from one or more atomic layers of graphene. Thus, in some implementations, a graphene particle described herein comprises, consists, or consists essentially of one or more graphene sheets. A graphene sheet, in some implementations, comprises a single molecular or atomic layer having a flat planar structure. Any number of graphene sheets not inconsistent with the objectives of the present disclosure may be used. In some implementations, a graphene particle comprises a plurality of graphene sheets. The plurality of graphene sheets, in some implementations, can be arranged in a randomly stacked or layered configuration. In other implementations, a graphene particle comprises or consists of a single randomly oriented graphene sheet. Therefore, in some implementations, a graphene particle described herein comprises 1 or more atomic layers of graphene. In some implementations, a graphene particle comprises between 1 and 10 atomic layers of graphene. In some implementations, a graphene particle comprises between 1 and 5 atomic layers or between 1 and 3 atomic layers of graphene. In other instances, a graphene particle comprises between 1 and 1000 atomic layers, between 1 and 500 atomic layers of graphene, or between 1 and 100 atomic layers of graphene.

Further, in some implementations comprising graphene platelets, the platelets have an average thickness of up to about 1000 nm or up to about 100 nm. In some instances, graphene platelets have an average thickness of about 0.3 nm to about 1 nm, about 1 nm to about 1000 nm, about 1 nm to about 100 nm, about 1 nm to about 10 nm, or about 300 nm to about 1000 nm. Moreover, in some cases, such graphene platelets have an average length and/or width of up to about 1 μm, up to about 1 cm, or up to about 5 cm. In some instances, graphene platelets or other graphene particles have an average length and/or an average width between about 1 μm and about 5 cm, between about 1 μm and about 1 cm, between about 1 μm and about 500 μm, between about 1 μm and about 100 μm, between about 1 μm and about 10 μm, between about 5 μm and about 1 cm, between about 5 μm and about 500 μm, between about 5 μm and about 100 μm, between about 10 μm and about 1 cm, between about 10 μm and about 500 μm, between about 10 μm and about 100 μm, between about 50 μm and about 1 cm, between about 100 μm and about 1 cm, or between about 100 μm and about 500 μm.

Additionally, in some implementations, anisotropic graphene particles have a random orientation within the matrix of a composite material described herein. For example, in some cases, the graphene is provided as a plurality of randomly oriented graphene platelets. A "random" orientation, for reference purposes herein, is relative to the direction of a unique axis of the anistropic particles. In some implementations, for instance, a random orientation comprises an orientation in which the Z axes of the particles are randomly oriented in three-dimensional space, where the Z axis of a particle can correspond to the thickness of the particle, as opposed to the length or width of the particle. Thus, randomly oriented particles can be contrasted with oriented or aligned particles.

However, it is also possible for the graphene particles of a composite material described herein to have an aligned orientation within the matrix of the composite material. An aligned orientation of graphene particles, in some cases, can be obtained using a shear force during extrusion of a mixture of the graphene particles and the matrix material to form the composite material. It is also possible to obtain an aligned orientation of graphene particles using a method described in U.S. Pat. No. 8,263,843 to Kim et al. Moreover, in some cases, the graphene particles are oriented to conduct heat to the edges of the first external support structure and/or the second external support structure.

Graphene particles described herein can be present in a composite material in any amount not inconsistent with the objectives of the present disclosure. In some cases, for instance, the composite material comprises graphene particles in an amount of from about 1 volume % to about 90 volume %, based on the total volume of the composite material. In another variation, the matrix material comprises graphene particles in an amount of from about 1 volume % to about 60 volume %, about 1 volume % to about 40 volume %, about 1 volume % to about 20 volume %, or about 1 volume % to about 10 volume %. In yet another variation, the matrix material comprises graphene particles in an amount of from about 5 volume % to about 30 volume % or about 5 volume % to about 20 volume %. In still another variation, the matrix material comprises graphene particles in an amount of from about 5 volume % to about 10 volume %. In a further variation, the matrix material comprises graphene particles in an amount of from about 1 volume % to about 5 volume %. In addition, in some cases, the amount of graphene dispersed in a matrix described herein in selected based on the thermal conductivity of the matrix and/or a desired thermal conductivity of the composite material. For example, in some instances, a higher amount of graphene is added to a matrix material having a lower thermal conductivity. In particular, in some implementations comprising a non-conductive or minimally conductive matrix material such as some polymeric matrix materials described herein, graphene particles are dispersed in the matrix in an amount above the percolation limit. Similarly, in other cases, a lower amount of graphene can be added to a matrix material having a higher thermal conductivity.

Moreover, in some implementations, the size, shape, and volume % of graphene particles in a matrix described herein are selected to have a minimal impact on the mechanical properties and/or processability of the matrix material. For example, in some cases, graphene platelets having a thickness of up to about 10 nm, a width of up to about 100 mm, and a length of up to about 1 cm are used in an amount up to about 20 volume %. In some such instances, the tensile strength and/or tensile modulus of the matrix material is altered by less than about 20%, less than about 15%, less than about 10%, or less than about 5% by the inclusion of the graphene platelets, based on the tensile strength and/or tensile modulus of the matrix material without any graphene platelets. The tensile strength and/or tensile modulus of a matrix or composite material can be measured in any manner not inconsistent with the objectives of the present disclosure. In some cases, the tensile strength and/or tensile modulus is measured by ASTM D3552 or ASTM E8. In some implementations, the Charpy impact and/or ductile-brittle transition temperature (DBTT) of the matrix material is altered by less than about 15%, less than about 10%, less than about 5%, or less than about 1% by the inclusion of the graphene platelets, based on the Charpy impact and/or DBTT of the matrix material without any graphene platelets. The Charpy impact and/or DBTT of a matrix or composite material can be measured in any manner not inconsistent with the objectives of the present disclosure. In some cases, the Charpy impact and/or DBTT is measured by a four-point bending test at a range of temperatures or in a manner according to ASTM A370 and/or ASTM E23.

A composite material described herein can be manufactured in any manner not inconsistent with the objectives of the present disclosure, including the following exemplary processes. In one process, graphene particles such as graphene platelets are provided in a dry form or in a dispersed form in a solvent. If provided in a solvent, the graphene particles can be dispersed in a solvent having a low boiling point such as, for example, acetone, alcohol, or a similar solvent. The graphene particles are then introduced to a thin metal or polymeric mesh or other porous network, including an isotropic or randomly oriented mesh or network. The graphene particles are captured on or within the mesh or network, and the solvent is removed by heating to form the composite material. In one variation, the mesh or network is formed from a metal such as aluminum, aluminum alloy, copper, copper alloy, titanium, titanium alloy, stainless steel, brass, or a combination thereof. If desired, the process may be repeated with multiple layers stacked to form a composite building block. According to one variation, the composite block may be further hot and/or cold worked to reach a desired thickness and density. Shaping may then be performed by any method to achieve a desired shape.

In another variation, the graphene-containing composite material can be formed by hot melting and/or extruding a graphene/matrix mixture. According to another variation, a graphene-containing composite material is formed by forming graphene layers in a loosely connected thin sheet form with a metal matrix by hot melt or electrolytic/electrolysis plating to form a composite building block. The composite building blocks can then be processed as described above if desired. For example, the composite building blocks can be stacked, hot pressed, cold formed and/or machined/shaped. In a further implementation, graphene-containing composites may be formed using randomly oriented graphene sheets and conventional powder metallurgical processing. Moreover, graphene-containing composites may be formed by an additive manufacturing process, such as direct metal laser sintering.

In some implementations of a conduction cooled module described herein, the component envelope defined by first and second external support structures may have a height of between about 0.05 inches and about 2.5 inches. In certain other implementations, the component envelope may have a height of between about 0.1 inches and about 2.0 inches, or between about 0.2 inches and about 1.5 inches. In some implementations, the first and/or second exterior support structures may have a total width of between about 7 inches and about 8 inches. In certain other implementations, the first and/or second exterior support structures may have a total width of between about 7.1 and about 7.8 inches, or between about 7.3 and about 7.6 inches. In some implementations of a conduction cooled module as described herein, the first and/or second external support structures may have a total length of between about 8 and about 11 inches. In certain other implementations, the first and/or second external support structures may have a total length of between about 8.5 and about 10.5 inches, or between about 9 and about 10 inches.

In certain implementations of a conduction cooled module described herein, the PWB may be a PWB or a printed circuit board ("PCB"). In some implementations, PWBs may be configured or designed to comply with certain standards or form factors. For example, in some implementations, the PWB is compliant with ARINC 600 series standards published by Aeronautical Radio, Incorporated, or is an ARINC 600-sized PWB. In one implementation of a conduction cooled module described herein, the PWB may have a thickness between about 0.05 and 0.25 inches. In another implementation, the PWB may have a thickness between about 0.08 and about 0.17 inches, or between about 0.9 and about 0.15 inches. Further, in some implementations, the PWB may have a width between about 5 and about 9 inches. Alternatively, in some implementations, the PWB may have a width between about 6 and about 8 inches, or between about 6.5 and about 8.5 inches. Moreover, in some implementations, the PWB may have a length between about 8 and about 12 inches. Alternatively, in some implementations the PWB may have a length between about 9 and about 11 inches, or between about 9.5 and about 10.5 inches.

In some implementations of a conduction cooled module described herein, thermal interface materials (TIMs) can be used between a PWB and an external support structure. TIMs are often used to fill microscopic voids and to reduce thermal resistances, thereby facilitating heat transfer between two objects or materials in contact with one another. Any TIM not inconsistent with the objectives of the present disclosure may be used. TIMs can comprise or be formed from foam, malleable material, or paste. For example, in some cases, a ceramic powder suspended in a liquid or gelatinous material can be used. In some implementations, the liquid or gelatinous material is silicone. In such implementations, the ceramic powder can comprise one or more of beryllium oxide, aluminum nitride, aluminum oxide, zinc oxide, and/or silicon dioxide. In certain other implementations, a metal-based grease containing solid metal particles can be used. For example, silver or aluminum particles can be disposed in a silicone grease. In some implementations, TIMs can comprise, consist, or consist essentially of diamond powder, carbon fibers, and/or graphene.

In some implementations, a conduction cooled module described herein can further comprise a connector envelope engaging the first external support structure and the second external support structure on one end of the first and second external support structures. In some implementations, a conduction cooled module comprising a connector envelope can be configured to engage with an electrical backplane of a conduction cooling rack or other electrical and/or electronic assembly. In some implementations, the connector envelope is external to the first and second external support structures and can be configured to interface an opposing electrical backplane from which power and signals are received and transmitted. In such implementations, the connector envelope places the PWB in electrical communication with the electrical backplane. Therefore, in some implementations, the electrical backplane is disposed within a conduction cooling rack, or may be a component of a larger electrical and/or cooling rack. Further illustration and description of the connector envelope and its interconnectivity with certain other elements or components is provided hereinbelow with reference to the figures.

In certain implementations, the connector envelope has a length that is less than or about equal to the height of the module. In further implementations, the connector envelope has a module width and depth of from about 0.5 inches to about 1 inch. In certain other implementations, the connector envelope has a length which is between about 5 and about 10 inches. In other implementations, the connector envelope has a length which is between about 6 and about 9 inches, or between about 6.5 and about 8 inches. In some implementations of a conduction cooled module described herein, the connector envelope has a width between about 0.5 and about 3 inches. In certain other implementations, the connector envelope has a width between about 0.75 and about 2 inches, or between about 1.0 and about 1.5 inches. Further, in some implementations of a conduction cooled module described herein, the connector envelope has a thickness between about 0.3 and about 1.5 inches. In certain other implementations, the connector envelope has a thickness between about 0.5 and about 1.3 inches, or between about 0.6 and about 1.0 inches.

Turning now to the figures, FIG. 1 illustrates a cross-sectional front view of a conduction cooled module according to one implementation described herein. As illustrated in FIG. 1, a conduction cooled module (100) comprises first and second external support structures (110, 120) wherein the second external support structure (120) is in facing opposition to the first external support structure (110). The first and second external support structures (110, 120) define a component envelope (170), and are configured to contact a cold plate (140). The component envelope comprises a first component envelope portion (171) and a second component envelope portion (172). A PWB (130) is retained in the component envelope (170) located between the first and second external support structures (110, 120). In the implementation of FIG. 1, the first and second external support structures (110, 120) form continuous heat conduction pathways between the PWB (130) and the cold plate (140).

Directional arrows in FIG. 1 illustrate continuous heat transfer pathways from the PWB (130) through the first and second external support structures (110, 120) to the cold plate (140). In some implementations, the first and second external support structures (110, 120) form the primary heat conduction pathways between the PWB (130) and the cold plate (140). As used herein, the term "primary heat conduction pathway" refers to the pathway by which the majority of heat conduction travels. The term majority may refer to greater than about 50 percent to less than or equal to about 100 percent of heat conduction. In some implementations, the proportion of heat conduction which travels through the first and second external support structures (110, 120) is between about 60 percent and about 90 percent. In alternative implementations, the proportion of heat conduction traveling through the first and second external support structures (110, 120) is between about 65 percent and about 85 percent, or between about 75 percent and 95 percent of heat conduction.

FIG. 2 illustrates a cross-sectional front view of an implementation of a conduction cooled module (200) described herein. As illustrated in FIG. 2, the module (200) may further comprise a thermally conductive substrate (250) disposed between the first and second external support structures (210, 220) in the component envelope (270), the component envelope comprising a first component envelope portion (271) and a second component envelope portion (272). In certain implementations, the substrate (250) may be configured to contact at least one PWB (230A, 230B). In some implementations, as illustrated in FIG. 2, the thermally conductive substrate (250) may be configured to contact a first PWB (230A) on a first side of the substrate (250) and a second PWB (230B) on a second side of the substrate (250).

In the implementation of FIG. 3, the conduction cooled module (300) comprises first and second external support structures (310, 320) which are configured to retain at least one PWB (330A, 330B), wherein the PWBs (330A, 330B) comprise one or more electronic components (360A, 360B, 360C, 360D, 360E) extending into the first and second component envelope portions (371, 372) of the component envelope (370) above the surface of the PWBs (330A, 330B).

FIG. 4A illustrates a cross-sectional side view of one implementation of a conduction cooled module described herein. FIG. 4B illustrates a cross-sectional top view of the conduction cooled module of FIG. 4A, sectioned along line A-A. FIG. 4C illustrates a cross-sectional front view of the conduction cooled module of FIG. 4A, sectioned along line B-B. The conduction cooled module of FIGS. 4A (400A), 4B (400B), and 4C (400C) comprises first external support structures (410A, 410B, 410C) and second external support structures (420A, 420B, 420C), respectively, in facing opposition to one another and defining a component envelope (470B, 470C), the component envelope having first and second component envelope portions (471B, 471C, 472B, 472C). In the implementation of FIGS. 4A, 4B, and 4C, the first external support structures (410A, 410B, 410C) and second external support structures (420A, 420B, 420C) are configured to contact at least one cold plate (440C) and to retain at least one printed wiring board (430A, 430B, 430C) in the component envelope.

FIGS. 5A, 5B, 5C, and 5D illustrate cross-sectional front views of various implementations of conduction cooled modules (500A, 500B, 500C, 500D) described herein. In such implementations, the first external structures (510A, 510B, 510C, 510D) and second external support structures (520A, 520B, 520C, 520D) are in facing opposition to one another and are configured to retain at least one PWB (530A, 530B, 530C, 530D), wherein the PWB (530A, 530B, 530C, 530D) divides the component envelope (570A, 570B, 570C, 570D) into a first component envelope portion (571A, 571B, 571C, 571D) and a second component envelop portion (572A, 572B, 572C, 572D). In some implementations, as illustrated in FIGS. 5A and 5D, the first and second envelope portions may have substantially equal heights. In certain other implementations, as illustrated in FIGS. 5B and 5C, the first and second envelope portions have substantially different heights.

FIG. 6 illustrates a cross-sectional front view of one implementation of a conduction cooled module (600) described herein. In the implementation of FIG. 6, first and second external support structures (610, 620) are in facing opposition to one another and are configured to retain at least one PWB (630). The first and second external support structures (610, 620) of FIG. 6 further comprise more heat exchanger surfaces (673) extending into the first and second component envelope portions (671, 672) of the component envelope (670).

Figure 7A:
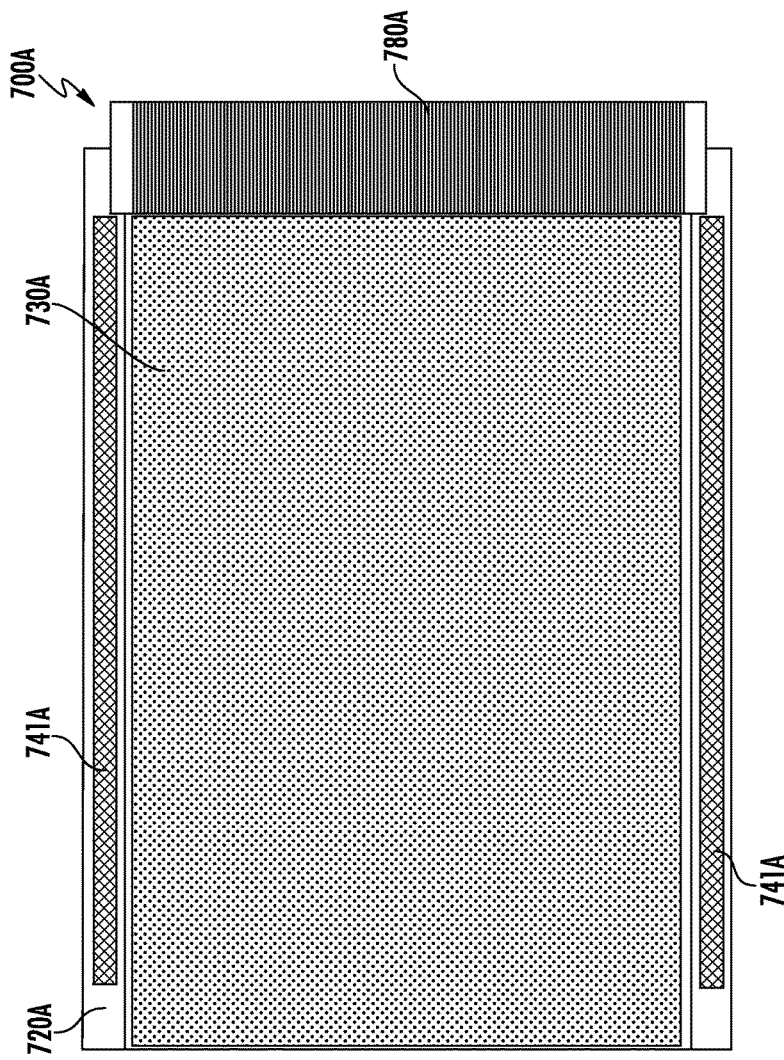
FIGS. 7A and 7B illustrate a cross-sectional side view of a conduction cooled module according to one implementation described herein and a cross-sectional top view of a conduction cooled module according to one implementation described herein, respectively.
Figure 7B:
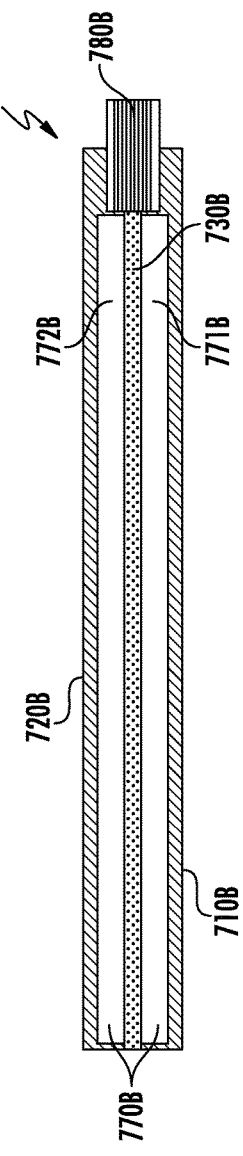

FIG. 7A illustrates a cross-sectional side view of one implementation of a conduction cooled module described herein, and FIG. 7B illustrates a cross-sectional top view of a conduction cooled module according to one implementation described herein. The implementation of FIGS. 7A and 7B comprise, a first external support structure (710B in FIG. 7B, which is not visible in the view of FIG. 7A) and a second external support structure (720A, 720B) in facing opposition to one another and defining a component envelope (770B, which is made up of first and second component envelope portions, 771B and 772B, respectively) the first and second external support structures being configured to retain at least one PWB (730A, 730B). An expanding clamp 741 illustrated in FIG. 7A can be used to secure the conduction cooled module (e.g., 700A, 700B) in at least one cold plate (not shown). Expanding clamps (841A) illustrated in FIG. 8A can be used to secure the conduction cooled module (e.g., 700A, 700B, 800A) in at least one cold plate (not shown). The implementation of FIGS. 7A and 7B further comprises a connector envelope (780A, 780B) engaging the first external support structure (710B in FIG. 7B, which is not visible in the view of FIG. 7A) and the second external support structure (720A, 720B) on one end of the first and second external structures.

As illustrated in FIGS. 8A, 8B, and 8C, a conduction cooled module (800A, 800B, 800C) described herein can comprise a variety of configurations for contacting at least one cold plate (840A, 840B, 840C, 843A, 843B, 843C). In some implementations, the first and second external support structures (not shown) of a conduction cooled module (800A, 800B, 800C) may have a variety of shapes or configurations to accommodate contact with at least one cold plate (840A, 840B, 840C, 843A, 843B, 843C). For example, in the implementation illustrated in FIG. 8A, the first and second external support structures (not shown) of the conduction cooled module (800A) are configured to contact at least one cold plate (840A, 843A) with an expanding slot interface. The conduction cooled module (800A) may be secured and/or held in place by a slot interface (842A) and an expanding clamp (841A). In another implementation, as illustrated in FIG. 8B, the first and second external support structures (not shown) of the conduction cooled module (800B) are configured to contact the cold plates (840B, 843B) with a wedged interface. Alternatively, in the implementation of FIG. 8C, the first and second external support structures (not shown) of the conduction cooled module (800C) are configured to contact the cold plate (300) with a forked interface. As illustrated by FIG. 8C, the conduction cooled module (800C) can be secured and/or held in place by a slot interface (842C) and an expanding clamp (841C).

II. Conduction Cooling Rack

In another aspect, conduction cooling racks are described herein. In some implementations, a conduction cooling rack comprises a first cold plate surface and a second cold plate surface separated from and in facing opposition to the first cold plate surface, thereby defining an interior rack volume between the first and second cold plate surfaces. As utilized herein, the term "facing opposition" means that each of the first and second cold plate surfaces comprises first and second sides, wherein the first side of each cold plate surface is configured to face first side of the other cold plate surface. In some implementations, the conduction cooling rack further comprises one or more conduction cooled modules disposed in the interior rack volume between the first and second cold plate surfaces and in physical contact with the first and second cold plate surfaces. A conduction cooled module of a conduction cooling rack described herein can comprise any conduction cooled module described hereinabove in Section I. In certain implementations, the one or more conduction cooled modules comprise first and second external support structures in facing opposition to one another, thereby defining a component envelope therebetween. In addition, in some implementations, the first and second external support structures are configured to contact the first and second cold plate surfaces and to retain at least one PWB in the component envelope in between the first and second support structures.

Thus, in some implementations, conduction cooled modules installed between two cold plates can comprise or define a shelf of LRUs. Further, it is to be understood that a rack described herein could comprise multiple shelves. Such shelving could also comprise structural reinforcements such that the assembly could be optimized for weight. In another aspect, orientations are contemplated whereby an electrical connector's longest dimension is in the vertical plane, with cold plates located above and below rows of LRUs. Such an orientation would result in the interfacing electrical backplane's longest dimension oriented horizontally and parallel to that of the cold plates, and its second longest dimension oriented vertically and perpendicular to that of the cold plates. Such orientations would minimize the chances for foreign objects, such as, for example, dust particulates, moisture, etc., falling into and damaging electrical components (e.g., pins).

Conduction cooled modules can be secured or fastened into cooling racks by any means not inconsistent with the present disclosure. For example, in some implementations, retention or "holddown" mechanisms can be used to prevent movement of the conduction cooled modules relative to the cooling racks. Retention mechanisms can comprise, consist, or consist essentially of hooks, knobs, clips, clamps, pins, bolts, or grips. Similarly, ejection mechanisms can be present in cooling racks described herein. Ejection mechanisms may be configured to facilitate removal or replacement of conduction cooled modules. Any ejection mechanism not inconsistent with the objectives of the present disclosure can be used. For example, in some implementations, an ejection mechanism comprises one or more hooks, knobs, handles, latches, and/or springs. Ejection mechanisms, in some cases, can serve to release retention means and, in some implementations, provide an initial removal force which displaces a conduction cooled module from a fully inserted position in a cooling rack. Some examples of retention and ejection mechanisms are described in Appendix A of ARINC Standard 628, Part 7 (2001).

Figure 9:
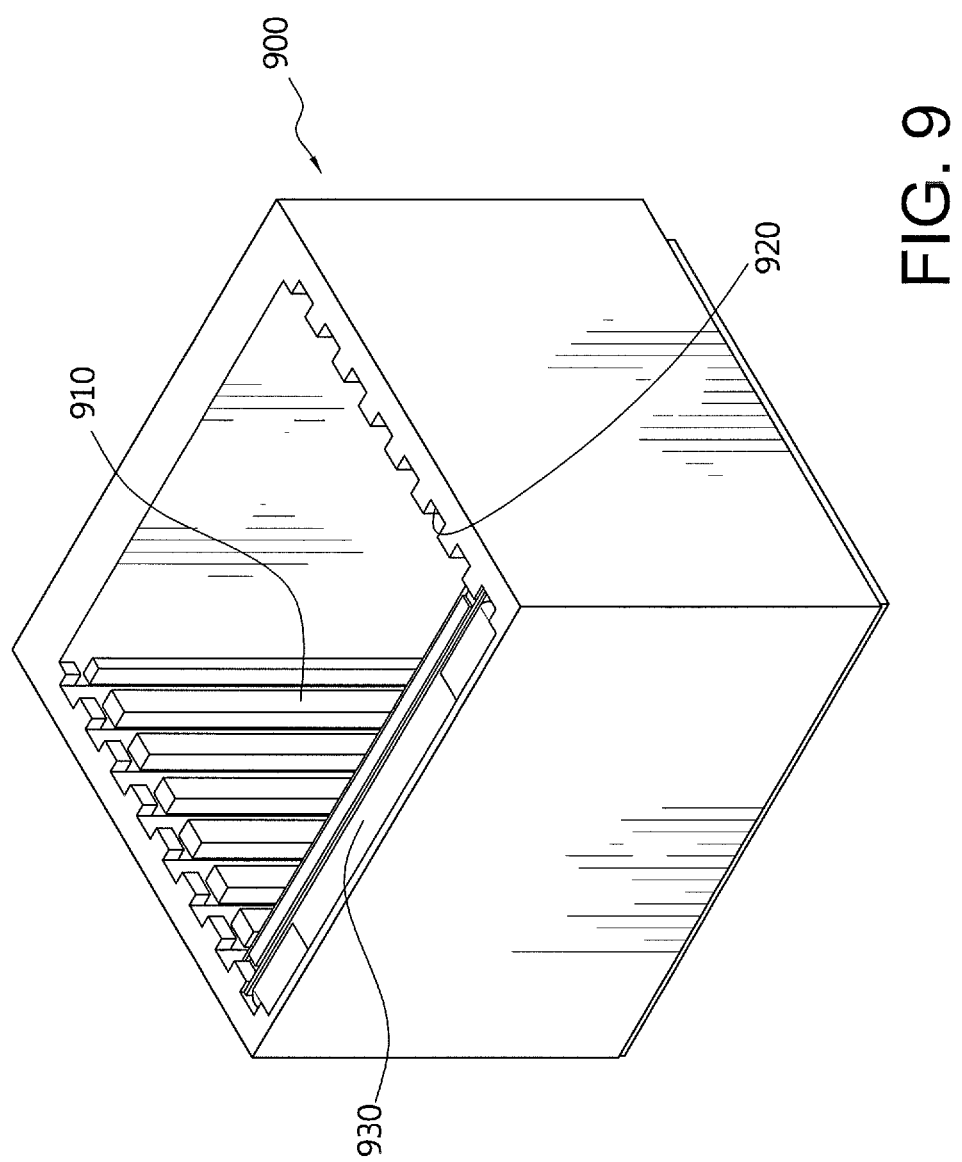
FIG. 9 illustrates a conduction cooling rack according to one implementation described herein.

Turning now to the figures, FIG. 9 illustrates a conduction cooling rack according to one implementation described herein. As illustrated in FIG. 9, a conduction cooling rack (900) as described herein comprises first and second cold plate surfaces (910, 920) in facing opposition to one another, forming an interior rack volume. One or more conduction cooled modules (930) are disposed in the interior rack volume. The conduction cooled module (930) comprises first and second external support structures (not shown) wherein the second external support structure (not shown) is in facing opposition to the first external support structure (not shown). The first and second external support structures (not shown) are configured to contact a cold plate (not shown). A PWB (not shown) is retained in the component envelope located between the first and second external support structures (not shown).

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A conduction cooled module comprising:
a first external support structure;
a second external support structure in facing opposition to the first external support structure, wherein the first and second external support structures are asymmetrical with respect to one another;
a component envelope defined by the first external support structure and the second external support structure and located between the first external support structure and the second external support structure;
at least one cold plate defining a recess;
a thermally conductive substrate disposed between the first external support structure and the second external support structure and preventing the first and second external support structures from contacting one another, wherein a first portion of the first external support structure, a first portion of the second external support structure, and a first portion of the thermally conductive substrate are positioned at least partially within the recess in the at least one cold plate and held in place via an expanding clamp or a wedged interface, and wherein the first portion of the thermally conductive substrate protrudes farther into the recess than the first portions of the first and second external support structures;
at least one printed wiring board coupled to the thermally conductive substrate and positioned entirely within the component envelope, wherein no portion of the at least one printed wiring board is positioned at least partially within the recess in the at least one cold plate; and
a connector envelope engaging both the first external support structure and the second external support structure on one end of the first and second external support structures,
wherein the first external support structure and the second external support structure to contact the at least one cold plate and retain the at least one printed wiring board in the component envelope in between the first external support structure and the second external support structure;
wherein the first and second external support structures form heat conduction pathways between the at least one printed wiring board and the at least one cold plate.

2. The module of claim 1, wherein the first and second external support structures form continuous heat conduction pathways between the at least one printed wiring board and the at least one cold plate.

3. The module of claim 1, wherein the component envelope is enclosed by the first and second external support structures.

4. The module of claim 1, wherein the at least one printed wiring board has a thickness between 0.08 and 0.17 inches, a width between 5 and 9 inches, and a length between 8 and 12 inches.

5. The module of claim 1, wherein the at least one printed wiring board comprises a first printed wiring board and a second printed wiring board, and wherein the substrate contacts the first printed wiring board on a first side of the substrate and the second printed wiring board on a second side of the substrate in facing opposition to the first side of the substrate.

6. The module of claim 1, wherein the at least one printed wiring board comprises one or more electronic components extending into the component envelope above the surface of the at least one printed wiring board.

7. The module of claim 1, wherein the component envelope has a height between about 0.2 inches and about 1.5 inches.

8. The module of claim 1, wherein the first external support structure comprises a heat exchange surface coupled thereto and extending into the component envelope toward the at least one printed wiring board, wherein the heat exchange surface is not in contact with the at least one printed wiring board.

9. The module of claim 1, wherein the first external support structure and/or the second external support structure is formed from a composite material comprising graphene particles dispersed in a matrix material, wherein the graphene particles are a one-atom thick planar sheet of $sp^2$-bonded carbon atoms that are packed in a honeycomb crystal lattice, and wherein the graphene particles are dispersed in the matrix material in an amount above a percolation limit.

10. The module of claim 1, wherein the first external support structure and/or the second external support structure comprise a material selected from the group consisting of aluminum, aluminum alloy, copper, copper alloy, titanium, titanium alloy, stainless steel and combinations thereof.

11. The module of claim 1, wherein the conduction cooled module is a line-replaceable unit.

12. The module of claim 1, wherein the at least one cold plate is a portion of a rack.

13. The module of claim 1, wherein an axis extends between the first and second external support structures, wherein the axis is parallel to a direction that the first and second external support structures extend into the recess, wherein the first portions of the first and second external support structures that are positioned at least partially within the recess are equidistant from the axis, and wherein second portions of the first and second external support structures that are positioned outside the recess are not equidistant from the axis.

14. The module of claim 13, wherein the second portions of the first and second external support structures are in a plane that is perpendicular to the axis, and wherein the distance between axis and the second portions of the first and second external support structures is measured in a plane that is perpendicular to the axis.

15. A conduction cooling rack comprising:
a first cold plate surface;
a second cold plate surface separated from and in facing opposition to the first cold plate surface to define an interior rack volume; and
one or more conduction cooled modules disposed in the interior rack volume between the first cold plate surface and the second cold plate surface and in physical contact with the first cold plate surface and the second cold plate surface, at least one of the conduction cooled modules comprising
a first external support structure;
a second external support structure in facing opposition to the first external support structure;
a component envelope defined by the first external support structure and the second external support structure and located between the first external support structure and the second external support structure;
a thermally conductive substrate disposed between and contacting the first external support structure and the second external support structure and preventing the first and second external support structures from contacting one another, wherein a first end portion of the first external support structure, a first end portion of the second external support structure, and a first end portion of the thermally conductive substrate are positioned at least partially within a recess in the first cold plate surface and held in place via a first expanding clamp or a first wedged interface, wherein a second end portion of the first external support structure, a second end portion of the second external support structure, and a second end portion of the thermally conductive substrate are positioned at least partially within a recess in the second cold plate surface and held in place via a second expanding clamp or a second wedged interface, and wherein the first end portion of the thermally conductive substrate protrudes farther into the recess in the first cold plate than the first end portions of the first and second external support structures;
at least one printed wiring board coupled to the thermally conductive substrate and positioned entirely within the component envelope, wherein no portion of the at least one printed wiring board is positioned at least partially within the recess in the first cold plate; and
a connector envelope engaging both the first external support structure and the second external support structure on one end of the first and second external support structures,
wherein the first external support structure and the second external support structure contact the first cold plate surface and the second cold plate surface and retain the at least one printed wiring board in the component envelope in between the first external support structure and the second external support structure;
wherein the first and second external support structures form heat conduction pathways between the at least one printed wiring board and the first and second cold plate surfaces; and
wherein the first and second external support structures are asymmetrical with respect to one another such that an axis extends between the first and second external support structures, wherein the axis is parallel to a direction that the first and second external support structures extend into the recesses in the first and second cold plates, wherein the first end portions and the second end portions of the first and second external support structures that are positioned at least partially within the recesses in the first and second cold plates are equidistant from the axis, and wherein third portions of the first and second external support structures that are positioned outside the recesses in the first and second cold plates are not equidistant from the axis.

16. The rack of claim 15, wherein the first external support structure and/or the second external support structure is formed from a composite material comprising graphene particles dispersed in a matrix material, wherein the graphene particles have a random orientation in which Z axes of the graphene particles are randomly oriented in three-dimensional space, wherein the Z axes correspond to thicknesses of the graphene particles, and wherein the thicknesses are up to about 10 nm, widths of the graphene particles are up to about 100 mm, and lengths of the graphene particles are up to about 1 cm.

17. The rack of claim 15, wherein the first external support structure and/or the second external support structure comprise a material selected from the group consisting of aluminum, aluminum alloy, copper, copper alloy, titanium, titanium alloy, stainless steel and combinations thereof.

18. A conduction cooled module comprising:
a first external support structure;
a second external support structure in facing opposition to the first external support structure;
a component envelope defined by the first external support structure and the second external support structure and located between the first external support structure and the second external support structure;
at least one cold plate defining a recess;
a thermally conductive substrate disposed between the first external support structure and the second external support structure and preventing the first and second external support structures from contacting one another;
at least one printed wiring board coupled to the thermally conductive substrate and positioned entirely within the component envelope, wherein first portions of the first external support structure, the second external support structure, and the thermally conductive substrate are positioned at least partially within the recess in the at least one cold plate, wherein the thermally conductive substrate protrudes farther into the recess than the first portions of the first and second external support structures, and wherein no portion of the at least one printed wiring board is positioned at least partially within the recess in the at least one cold plate;

a slot interface positioned at least partially within the recess, wherein the slot interface comprises first and second axial protrusions that extend into the recess, and wherein a gap is formed between the first and second axial protrusions;

an expanding clamp positioned within the gap; and a connector envelope engaging both the first external support structure and the second external support structure on one end of the first and second external support structures, wherein the first external support structure and the second external support structure to contact the at least one cold plate and retain the at least one printed wiring board in the component envelope in between the first external support structure and the second external support structure;

wherein the first and second external support structures form heat conduction pathways between the at least one printed wiring board and the at least one cold plate; and wherein the first and second external support structures are asymmetrical with respect to one another such that an axis extends between the first and second external support structures, wherein the axis is parallel to a direction that the first and second external support structures extend into the recess, wherein the first portions of the first and second external support structures that are positioned at least partially within the recess are equidistant from the axis, and wherein second portions of the first and second external support structures that are positioned outside the recess are not equidistant from the axis.

19. The module of claim 18, wherein the first and second axial protrusions of the slot interface axially-overlap with first and second axial protrusions of the at least one cold plate, and wherein the slot interface further comprises first and second lateral protrusions that at least partially laterally-overlap with the first and second axial protrusions of the at least one cold plate.

20. The module of claim 19, wherein the expanding clamp does not contact the first and second axial protrusions of the at least one cold plate.

* * * * *